United States Patent
Ko et al.

(10) Patent No.: US 12,256,492 B2
(45) Date of Patent: Mar. 18, 2025

(54) PRINTED CIRCUIT BOARD

(71) Applicant: SAMSUNG ELECTRO-MECHANICS CO., LTD., Suwon-si (KR)

(72) Inventors: Chan Hoon Ko, Suwon-si (KR); Ki Hee Cho, Suwon-si (KR); Sang Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 164 days.

(21) Appl. No.: 17/983,766

(22) Filed: Nov. 9, 2022

(65) Prior Publication Data
US 2023/0354520 A1 Nov. 2, 2023

(30) Foreign Application Priority Data
Apr. 29, 2022 (KR) ........................ 10-2022-0053413

(51) Int. Cl.
H05K 1/11 (2006.01)
(52) U.S. Cl.
CPC ...... *H05K 1/111* (2013.01); *H05K 2201/2081* (2013.01)
(58) Field of Classification Search
None
See application file for complete search history.

(56) References Cited

U.S. PATENT DOCUMENTS

| | | | | |
|---|---|---|---|---|
| 6,461,493 B1* | 10/2002 | Farooq | ................... | H05K 3/445 361/311 |
| 2002/0033531 A1* | 3/2002 | Matsushima | ........... | H01L 24/11 257/734 |
| 2010/0270067 A1* | 10/2010 | Choi | ..................... | H05K 3/3485 29/846 |
| 2012/0103931 A1 | 5/2012 | Furuta et al. | | |
| 2015/0156883 A1 | 6/2015 | Bong et al. | | |
| 2021/0243902 A1* | 8/2021 | Nakabayashi | ......... | H05K 3/381 |
| 2023/0123522 A1* | 4/2023 | Tanaka | ................... | H05K 1/115 174/262 |
| 2023/0300987 A1* | 9/2023 | Kyozuka | .............. | H05K 3/0011 174/250 |

FOREIGN PATENT DOCUMENTS

JP 2010-206193 A 9/2010
KR 10-2015-0064976 A 6/2015

* cited by examiner

*Primary Examiner* — Timothy J Thompson
*Assistant Examiner* — Paramita Ghosh
(74) *Attorney, Agent, or Firm* — Morgan, Lewis & Bockius LLP

(57) ABSTRACT

A printed circuit board includes a first insulating layer, a metal pad including a first metal portion disposed on the first insulating layer, and a second metal portion disposed on the first metal portion and integrated with the first metal portion without a boundary therebetween, the second metal portion having a width narrower than a width of the first metal portion on a cross section, a second insulating layer disposed on the first insulating layer and covering at least a portion of a side surface of the first metal portion, and a surface metal layer disposed on the metal pad and covering at least a portion of each of an upper surface and a side surface of the second metal portion.

25 Claims, 9 Drawing Sheets

PRINTED CIRCUIT BOARD

CROSS-REFERENCE TO RELATED APPLICATION(S)

This application claims benefit of priority to Korean Patent Application No. 10-2022-0053413 filed on Apr. 29, 2022 in the Korean Intellectual Property Office, the disclosure of which is incorporated herein by reference in its entirety.

TECHNICAL FIELD

The present disclosure relates to a printed circuit board.

BACKGROUND

As memory capacity increases, a number of packaged chips increases, and accordingly, in a wire bonding board, a number of bonding pads for connection to a chip is increasing. Therefore, the implementation of a fine pitch bonding finger is required.

On the other hand, in the case of a related art bonding pad formed by a general plating process, in the pad structure formed by various pretreatment and seed etching processes, the side of the pad is tapered and the edge is rounded, and thus, the actual contact area of wire bonding may be reduced, and not only the upper surface of the bonding pad but also the side surfaces are surface-treated with metal. Therefore, it may be difficult to secure a space margin. Surface-treated metal is disposed in the space in which stress is concentrated by the undercut between the bonding pad and the insulating material, and it may thus be vulnerable to external impacts causing issues such as bending of the substrate or the like due to thermal expansion and contraction.

SUMMARY

An aspect of the present disclosure is to provide a printed circuit board capable of implementing a fine pitch bonding finger.

An aspect of the present disclosure is to provide a printed circuit board capable of preventing damage to a pad from seed etching or pretreatment.

An aspect of the present disclosure is to provide a printed circuit board in which a sufficient space margin may be secured even after a metal surface treatment.

An aspect of the present disclosure is to provide a printed circuit board in which a problem caused by an external impact in a stress concentration space between a pad and an insulating material may be prevented.

An aspect of the present disclosure is to prevent damage to the pad, by the metal masking of a material different from a material of the pad, and to control the level at which the pad is etched by forming an additional insulating material having a thickness less than a thickness of the pad after seed etching.

According to an aspect of the present disclosure, a printed circuit board includes a first insulating layer; a metal pad including a first metal portion disposed on the first insulating layer, and a second metal portion disposed on the first metal portion and integrated with the first metal portion without a boundary therebetween, the second metal portion having a width narrower than a width of the first metal portion on a cross section; a second insulating layer disposed on the first insulating layer and covering at least a portion of a side surface of the first metal portion; and a surface metal layer disposed on the metal pad and covering at least a portion of each of an upper surface and a side surface of the second metal portion.

According to an aspect of the present disclosure, a printed circuit board includes a first insulating layer; a seed metal layer disposed on the first insulating layer; a metal pad including a first metal portion disposed on the seed metal layer, and a second metal portion disposed on the first metal portion and integrated with the first metal portion without a boundary therebetween, the second metal portion having a width narrower than a width of the first metal portion on a cross-section; and a second insulating layer disposed on the first insulating layer, the second insulating layer covering at least a portion of a side surface of the first metal portion and spaced apart from an upper surface of the first metal portion.

According to an aspect of the present disclosure, a printed circuit board includes a first insulating layer; a metal pad including a first metal portion disposed on a surface of the first insulating layer, and a second metal portion disposed on the first metal portion and having a width narrower than a width of the first metal portion; a second insulating layer disposed on the first insulating layer and covering at least a portion of a side surface of the first metal portion; and a surface metal layer covering at least a portion of an upper surface of the second metal portion. With reference to the surface of the first insulating layer, a height of the second insulating layer is smaller than a height of the second metal portion.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
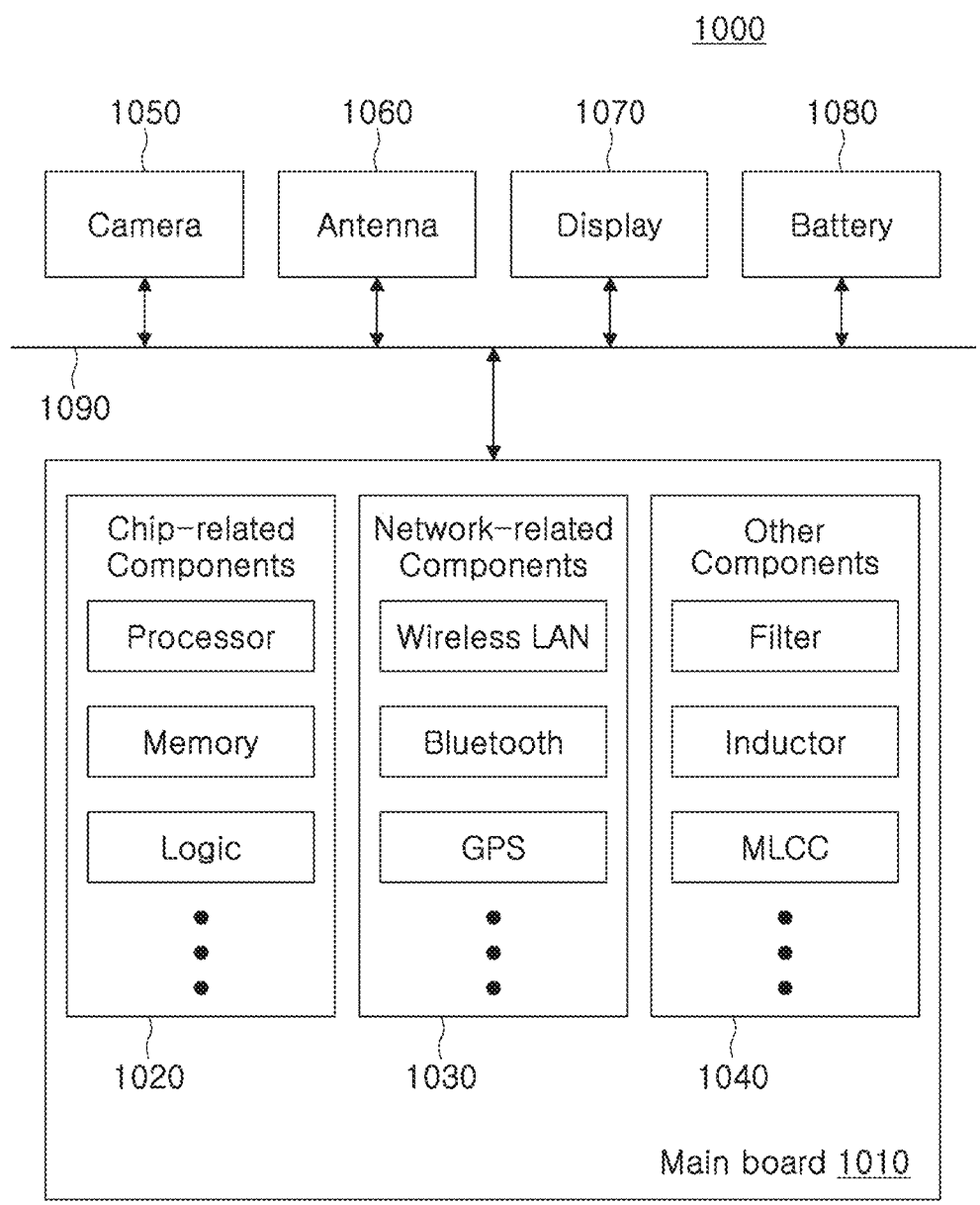
FIG. 1 is a block diagram schematically illustrating an example of an electronic device system.

Hereinafter, embodiments of the present disclosure will be described with reference to the accompanying drawings. The shapes and sizes of elements in the drawings may be exaggerated or reduced for clearer description.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related electronic components. In addition, the chip related components 1020 may be combined with each other. The chip-related component 1020 may be in the form of a package including the above-described chip or electronic component.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components in the form of a chip component used for various other purposes, or the like. In addition, other components 1040 may be combined with each other, together with the chip related components 1020 or the network related components 1030 described above.

Depending on a type of the electronic device 1000, the electronic device 1000 may include other electronic components that may or may not be physically or electrically connected to the mainboard 1010. Examples of other electronic components include a camera module 1050, an antenna module 1060, a display device 1070, a battery 1080, and the like. However, other electronic components are not limited thereto, and may include, for example, an audio codec, a video codec, a power amplifier, a compass, an accelerometer, a gyroscope, a speaker, a mass storage unit (e.g., a hard disk drive), a compact disk (CD) drive, a digital versatile disk (DVD) drive, and the like. In addition thereto, these other components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
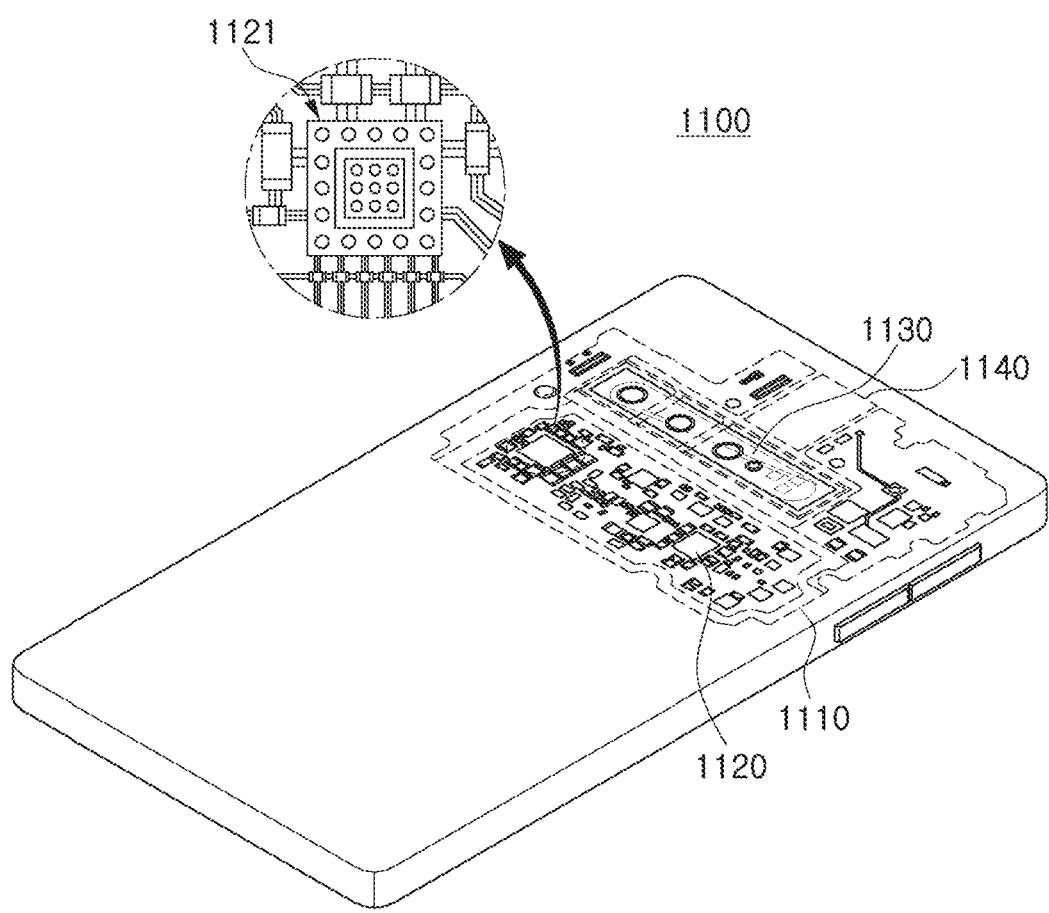
FIG. 2 is a perspective view schematically illustrating an example of an electronic device.

FIG. 2 is a schematic perspective view illustrating an example of an electronic device.

Referring to FIG. 2, the electronic device may be, for example, a smartphone 1100. A motherboard 1110 is accommodated inside the smartphone 1100, and various components 1120 are physically and/or electrically connected to the motherboard 1110. Also, other components that may or may not be physically and/or electrically connected to the motherboard 1110, such as a camera module 1130 and/or a speaker 1140, are accommodated in the smartphone 1100. A portion of the components 1120 may be the aforementioned chip-related component, for example, the component package 1121, but the present disclosure is not limited thereto. The component package 1121 may be in the form of a printed circuit board on which electronic components including active components and/or passive components are surface-mounted. Alternatively, the component package 1121 may be in the form of a printed circuit board in which active components and/or passive components are embedded. On the other hand, the electronic device is not necessarily limited to the smartphone 1100, and may also be other electronic devices as described above.

Printed Circuit Board

Figure 3:
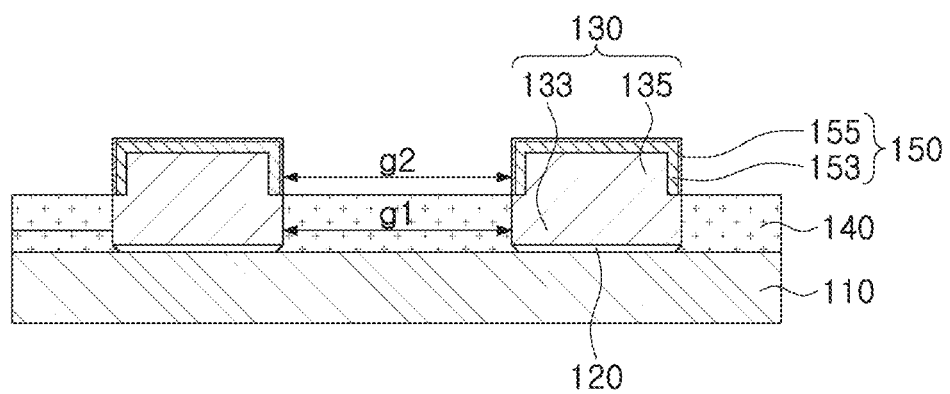
FIG. 3 is a cross-sectional view schematically illustrating an example of a printed circuit board.

FIG. 3 is a cross-sectional view schematically illustrating an example of a printed circuit board, and FIGS. 4A to 6B are cross-sectional views schematically illustrating effects of the printed circuit board of FIG. 3, respectively.

Referring to the drawings, a printed circuit board 100A according to an example includes a first insulating layer 110, a metal pad 130 disposed on the first insulating layer 110, and a second insulating layer 140 disposed on the first insulating layer 110 and covering a portion of the side surface of the metal pad 130. The metal pad 130 includes a first metal portion 133 and a second metal portion 135, and if necessary, may further include a seed metal layer 120 disposed on the first insulating layer 110 and/or a surface metal layer 150 disposed on the metal pad 130. The first metal portion 133 is disposed on the first insulating layer 110, in detail, on the seed metal layer 120. The second metal portion 135 is disposed on the first metal portion 133 and is integrated with the first metal portion 133 without a boundary therebetween.

Figure 4A:
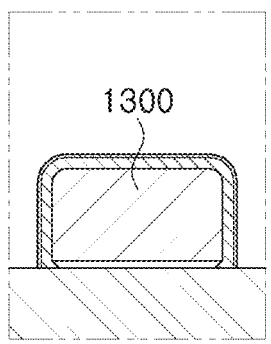
FIGS. 4A and 4B are cross-sectional views schematically illustrating an effect of the printed circuit board of FIG. 3.

On the other hand, as illustrated in FIG. 4A as an example, in the case of a metal pad 1300 formed by a general plating process, the edge of the upper surface of the metal pad 1300 may have a rounded shape by a seed etchant, or the like. In addition, the metal pad 1300 may have a tapered shape in which the width of the upper surface is narrower than the width of the lower surface. In this case, the actual contact area of wire bonding may be relatively small.

Figure 4B:
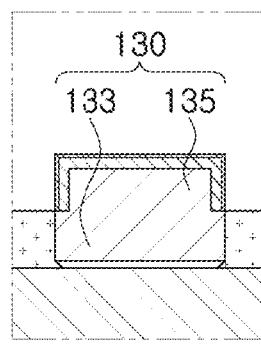

Meanwhile, as illustrated in FIG. 4B as an example, in the case of the printed circuit board 100A according to an example of the present disclosure, damage to the metal pad 130 by a seed etchant or the like may be prevented with a barrier metal layer including a metal different from the metal pad 130. Accordingly, respective side surfaces of the first metal portion 133 and the second metal portion 135 may have a substantially vertical shape, and the edges of respective upper surfaces of the first metal portion 133 and the second metal portion 135 may have a substantially angular shape. The side surface of the substantially vertical form may mean having an angle approximately perpendicular to the bottom surface, and also, the edge in the substantially angular shape may indicate that the edge is not substantially round. Therefore, the problem in which the actual contact area of wire bonding is narrowed may be efficiently prevented.

Figures 5A, 5B:
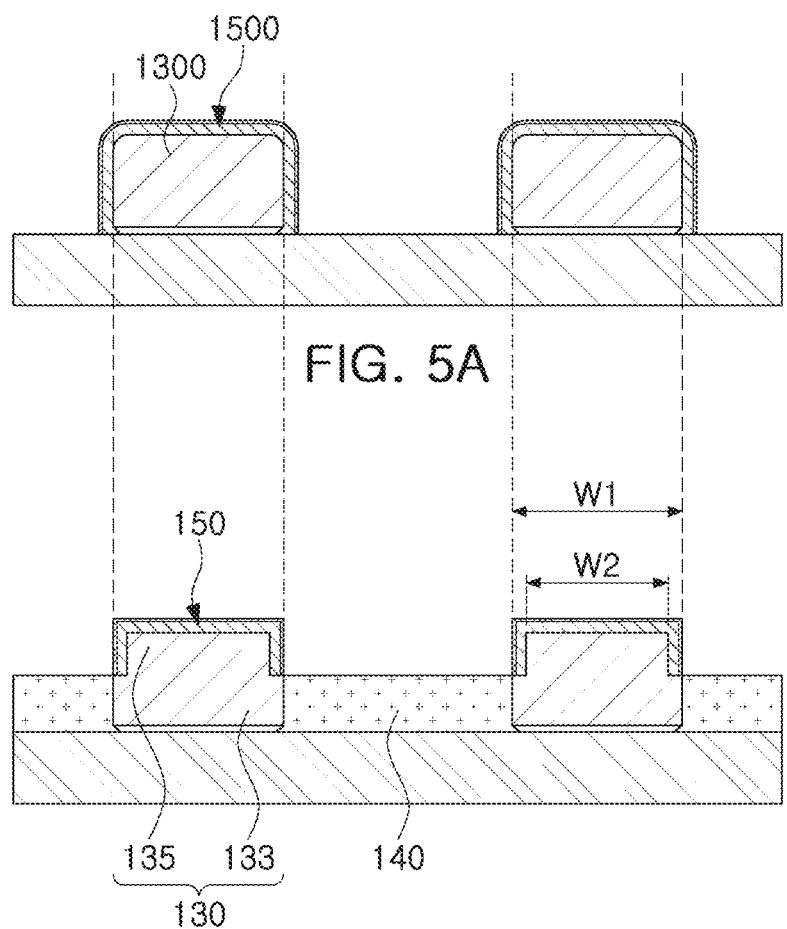
FIGS. 5A and 5B are cross-sectional views schematically illustrating another effect of the printed circuit board of FIG. 3.

Meanwhile, as illustrated in FIG. 5A as an example, the metal pad 1300 formed by a general plating process may have a surface metal layer 1500 formed on the side surface as well as the upper surface, and therefore, may be difficult to secure a space margin between the surface metal layers 1500 on the adjacent metal pads 1300. Therefore, there may be a limit to the implementation of the fine pitch bonding finger with this structure.

Meanwhile, as illustrated in FIG. 5B as an example, in the printed circuit board 100A according to an example of the present disclosure, a width W2 of the second metal portion 135 in the cross-section may be narrower than a width W1 of the first metal portion 133 in the cross-section. In the case in which the width in the cross section is not constant, the average width may be compared. In addition, the second insulating layer 140 may cover at least a portion of the side surface of the first metal portion 133, but may be spaced apart from the upper surface of the first metal portion 133. For example, the second insulating layer 140 may not cover the upper surface of the first metal portion 133, and the upper surface of the second insulating layer 140 may be substantially coplanar with the upper surface of the first metal portion 133. In this case, with reference to a surface of the first insulating layer 110 on which the metal pad 130 is disposed, a height of the second insulating layer 140 may be smaller than a height of the second metal portion 135. Being substantially coplanar may include not only a case in which the coplanar is perfectly coplanar, but also a case in which the coplanar is substantially coplanar due to a process error or the like. Accordingly, the surface metal layer 150 may selectively cover at least a portion of each of the upper surface and the side surface of the second metal portion 135. In this case, a space margin between the surface metal layers 150 on the adjacent metal pads 130 may be sufficiently secured. Therefore, it may be more advantageous for the implementation of fine pitch bonding fingers.

Figure 6A:
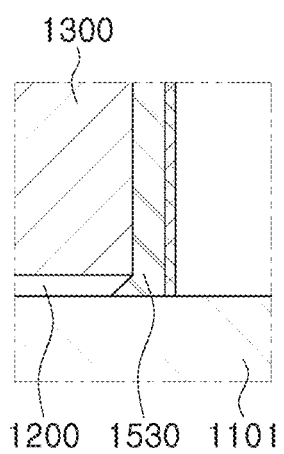
FIGS. 6A and 6B are cross-sectional views schematically illustrating another effect of the printed circuit board of FIG. 3.

On the other hand, as illustrated in FIG. 6A as an example, in the metal pad 1300 formed by a general plating process, due to the undercut between the metal pad 1300 and an insulating material 1101, occurring in the etching process of the seed metal layer 1200, a surface metal layer 1500, such as a hard nickel layer 1530, may be disposed in a notch region in which stress is concentrated, and may be in contact with the insulating material 1101, to be vulnerable to external impact. For example, a lift problem of the metal pad 1300 may occur due to warpage of the substrate due to thermal expansion and contraction.

Figure 6B:
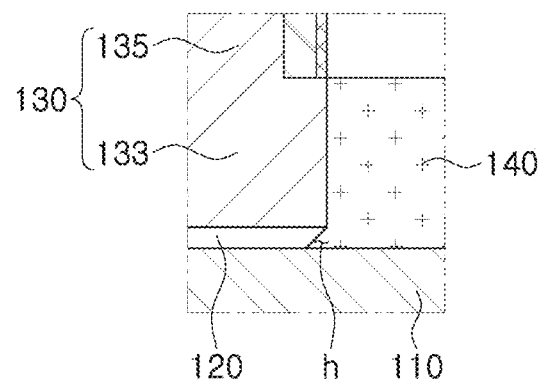

Meanwhile, as illustrated in FIG. 6B as an example, in the printed circuit board 100A according to an example of the present disclosure, the second insulating layer 140 may be disposed on the first insulating layer 110 to cover side surfaces of the seed metal layer 120 and the first metal portion 133. The second insulating layer 140 may include, for example, a solder resist material of which the thickness may be adjusted to selectively cover the first metal portion 133 among the first metal portion 133 and the second metal portion 135 by half development. Accordingly, a groove portion h formed in at least a portion of the side surface of the seed metal layer 120, for example, the groove portion h having a tapered upper surface may be filled with the second insulating layer 140. Because the surface metal layer 150 does not extend between the second insulating layer 140 and the first metal portion 133, the second insulating layer 140 and the first metal portion 133 may be in contact with each other. Because the surface metal layer 150 does not extend between the second insulating layer 140 and the seed metal layer 120, the second insulating layer 140 and the seed metal layer 120 may be in contact with each other at a region having the groove portion h. In this case, the second insulating layer 140 may alleviate the above-described external impacts, and therefore, the lifting problem of the metal pad 130 and the like may be effectively prevented.

On the other hand, the metal pad 130 may be provided in plural, and the surface metal layer 150 may also be provided as a plurality of surface metal layers 150 and may be disposed on the metal pad 130. In this case, in the printed circuit board 100A according to an example, a gap g1 between the first metal portions 133 of two adjacent metal pads 130 among the plurality of metal pads 130 may be substantially the same as a gap g2 between second surface metal layers 155 of two surface metal layers 150 respectively disposed on the two adjacent metal pads 130 among the plurality of surface metal layers 150. The gap may be a value measured at an intermediate point of the target component with respect to the thickness direction or the lamination direction on the cross-section. Being substantially the same gap may include not only the case in which the intervals are completely identical, but also the case in which the intervals are approximately the same due to a process error. For example, the surface metal layer 150 may be formed to have a thickness corresponding to the width thereof without departing from the upper surface of the first metal portion 133. In this case, space margin management may be more effective.

Hereinafter, the components of the printed circuit board 100A according to an example will be described in more detail with reference to the drawings.

The first insulating layer 110 may include an insulating material. The insulating material may include thermosetting resins such as epoxy resins, a thermoplastic resin such as polyimide, or materials containing inorganic fillers, organic fillers and/or glass fibers (Glass Fiber, Glass Cloth, and/or Glass Fabric) together with these resins. The insulating material may be a photosensitive material and/or a non-photosensitive material. For example, as the insulating material, insulation materials of Solder Resist (SR), Ajinomoto Build-up Film (ABF), Prepreg (PPG), Resin Coated Copper (RCC), and Copper Clad Laminate (CCL) may be used, but is not limited thereto, and other polymer materials may be used in addition thereto.

The seed metal layer 120 may include a metal material. Metal materials may include copper (Cu), aluminum (Al), silver (Ag), tin (Sn), gold (Au), nickel (Ni), lead (Pb), titanium (Ti), and/or alloys thereof, and in detail, may include copper (Cu), but the present disclosure is not limited thereto. The seed metal layer 120 may be relatively thinner than the metal pad 130 and may be an electroless plating layer (or chemical copper), but the present disclosure is not limited thereto. For example, the seed metal layer 120 may be copper foil or the like.

The metal pad 130 may include a metal material. The first and second metal portions 133 and 135 of the metal pad 130 may include the same metal material. Metal materials may include copper (Cu), aluminum (Al), silver (Ag), tin (Sn), gold (Au), nickel (Ni), lead (Pb), titanium (Ti), and/or alloys thereof, and in detail, may include copper (Cu), but the present disclosure is not limited thereto. The metal pad 130 may perform various functions according to a design, and for example, may include a ground pad, a power pad, a signal pad, and the like. In this case, the signal pad may include a pad for electrical connection of various signals except for ground and power, for example, a data signal. The metal pad 130 may be an electrolytic plating layer (or electrolytic copper), and in this case, the first and second metal portions 133 and 135 may be simultaneously formed by plating.

The second insulating layer 140 may include an insulating material. The insulating material may include a resist, for example, a solder resist. The solder resist may contain an insulating resin and a filler, but may not contain glass fibers. The insulating resin may be a photosensitive insulating resin, and the filler may be an inorganic filler and/or an organic filler, but is not limited thereto. However, the material of the second insulating layer 140 is not limited thereto, and other polymer materials may be used if necessary.

The surface metal layer 150 may include a metal material. The first and second surface metal layers 153 and 155 of the surface metal layer 150 may include different metal materials. For example, the first surface metal layer 153 may include nickel (Ni), and the second surface metal layer 155 may include gold (Au), but is not limited thereto, and for example, may include other metal materials such as silver (Ag) and tin (Sn). The first surface metal layer 153 may be thicker than the second surface metal layer 155, but the present disclosure is not limited thereto. The surface metal layer 150 may be formed by, for example, electrolytic gold plating, electroless gold plating, Organic Solderability Preservative (OSP) or electroless tin plating, electroless silver plating, electroless nickel plating/substitution gold plating, Direct Immersion Gold (DIG) plating, Hot Air Solder Leveling (HASL), or the like.

On the other hand, the printed circuit board 100A according to an example may be applied not only to such a single-layer board, but also to a multi-layer board. For example, the first insulating layer 110, the seed metal layer 120, the metal pad 130, the second insulating layer 140, and the surface metal layer 150 described above may be applied to the outermost layer of the multilayer substrate, and for example, may be applied to a package substrate in which a bonding pad is formed in a wire bonding area of the outermost layer of a multilayer printed circuit board.

FIGS. 7A to 7L are process diagrams schematically illustrating an example of manufacturing the printed circuit board of FIG. 3.

Figure 7A:
FIGS. 7A to 7L are process diagrams schematically illustrating an example of manufacturing the printed circuit board of FIG. 3.

Referring to FIG. 7A, a first insulating layer 110 having a first metal layer 121 disposed thereon is prepared. The first metal layer 121 may be formed by electroless plating (or chemical plating). Alternatively, the first metal layer 121 may be formed by laminating a copper foil or the like on the upper surface of the first insulating layer 110.

Figure 7B:
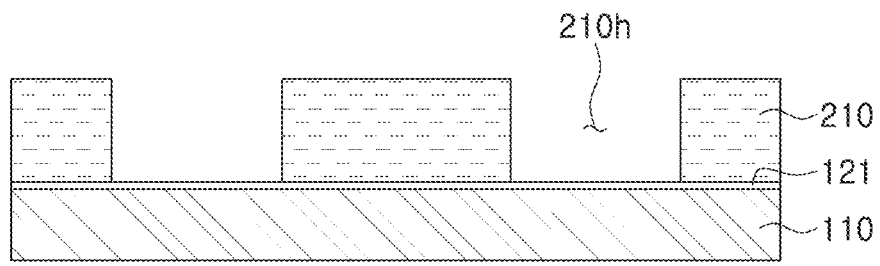

Referring to FIG. 7B, a resist film 210 having an opening 210h exposing the first metal layer 121 is formed on the first metal layer 121. For example, the resist film 210 is formed on the first metal layer 121 by a dry film lamination method or the like, and after partially exposing the resist film 210 using a mask, the opening 210h may be formed by developing the exposed resist film 210. The resist film 210 may include a photosensitive material, for example, may be a negative type resist film, but the present disclosure is not limited thereto.

Figure 7C:
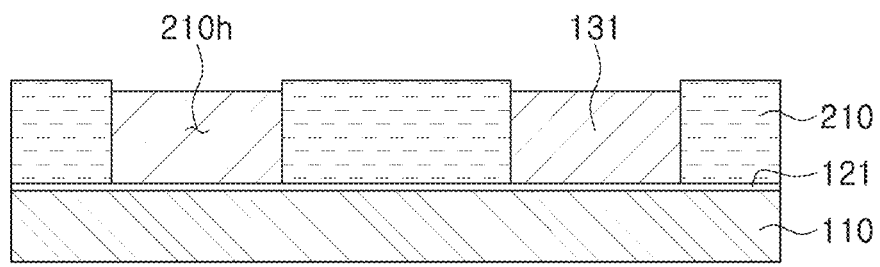

Referring to FIG. 7C, a second metal layer 131 filling at least a portion of the opening 210h is formed on the first metal layer 121 exposed through the opening 210h. The second metal layer 131 may be formed by an electrolytic plating (or electroplating). A portion of the uppermost portion of the opening 210h may remain unfilled with the second metal layer 131.

Figure 7D:
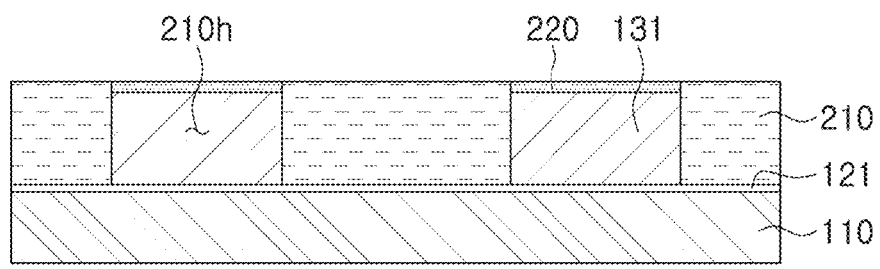

Referring to FIG. 7D, a barrier metal layer 220 is formed on the second metal layer 131 in the opening 210h. The barrier metal layer 220 may include a metal material, for example, nickel (Ni), different from a material of the first and second metal layers 121 and 131. The barrier metal layer 220 may be formed by electrolytic plating (or electroplating). The uppermost portion of the opening 210h may be filled with the barrier metal layer 220.

Figure 7E:
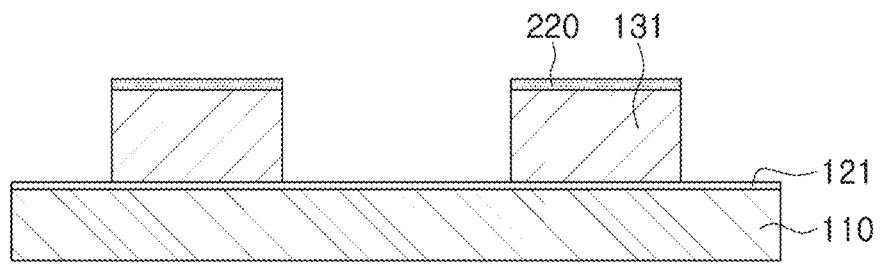

Referring to FIG. 7E, the resist film 210 is removed. For example, the resist film 210 may be removed by a peeling process. As the peeling process, physical peeling or chemical peeling using a stripper may be used.

Figure 7F:
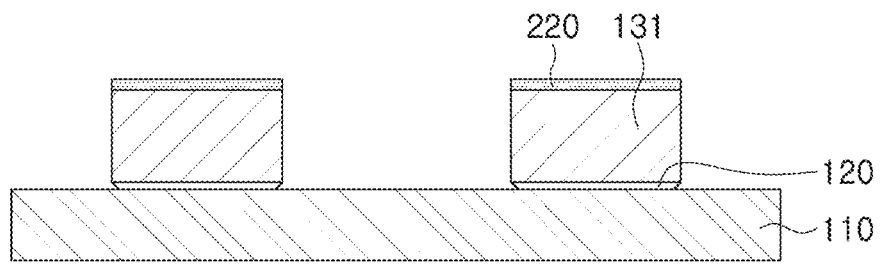

Referring to FIG. 7F, at least a partial region of the first metal layer 121 is etched. For example, a region of the first metal layer 121 in which the second metal layer 131 is not formed may be removed by seed etching using an etchant. As a result, the seed metal layer 120 may be formed between the first insulating layer 110 and the second metal layer 131. The etching is performed using the barrier metal layer 220, thereby preventing the side surface of the second metal layer 131 from being tapered and the edge of the upper surface of the second metal layer 131 from being rounded.

Figure 7G:
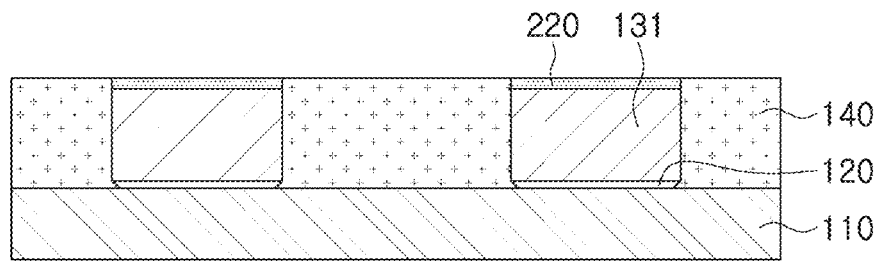

Referring to FIG. 7G, a second insulating layer 140 is formed on the first insulating layer 110, to cover respective side surfaces of the seed metal layer 120, the second metal layer 131, and the barrier metal layer 220. The second insulating layer 140 may be formed by coating a solder resist composition on the first insulating layer 110 and then drying the same, but the present disclosure is not limited thereto.

Figure 7H:
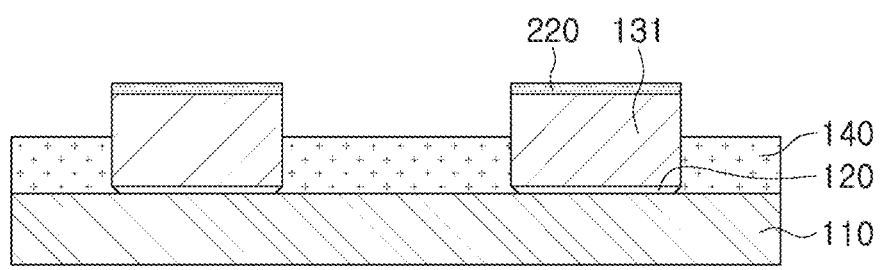

Referring to FIG. 7H, at least a portion of the second insulating layer 140 is removed. The thickness of the second insulating layer 140 may be thinner than the thickness of the second metal layer 131. For example, the upper surface of the second insulating layer 140 may be disposed to be lower than the upper surface of the second metal layer 131. A half development process may be used to partially remove the second insulating layer 140.

Figure 7I:
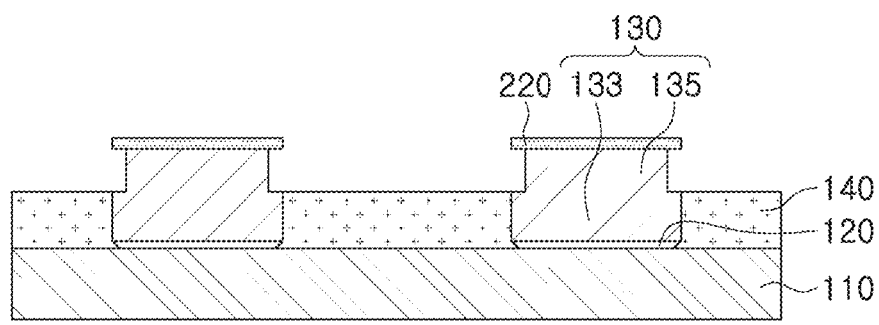

Referring to FIG. 7I, at least a portion of the second metal layer 131 is etched to form the metal pad 130 including the first and second metal portions 133 and 135. At this time, the side of the first metal portion 133 is covered with the second insulating layer 140, and the second metal portion 135 may be etched to have relatively narrower width on the cross-section of the second metal portion 135. In addition, the presence of the barrier metal layer 220 may prevent the side surface of the second metal portion 135 from being tapered and the edge of the upper surface of the second metal portion 135 from being rounded.

Figure 7J:
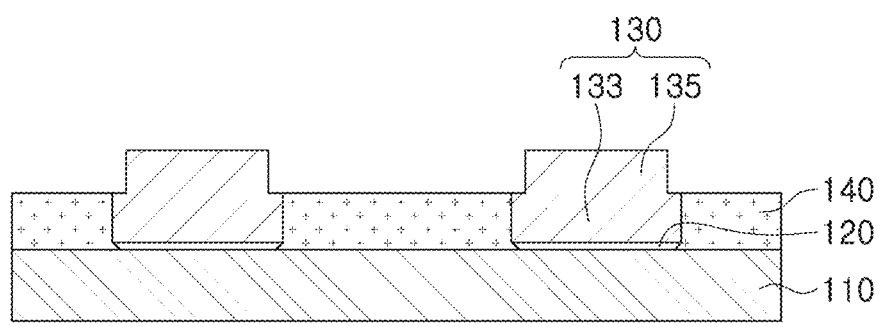

Referring to FIG. 7J, the barrier metal layer 220 is etched. For example, an etchant selectively reacting with the barrier metal layer 220 may be used.

Figure 7K:
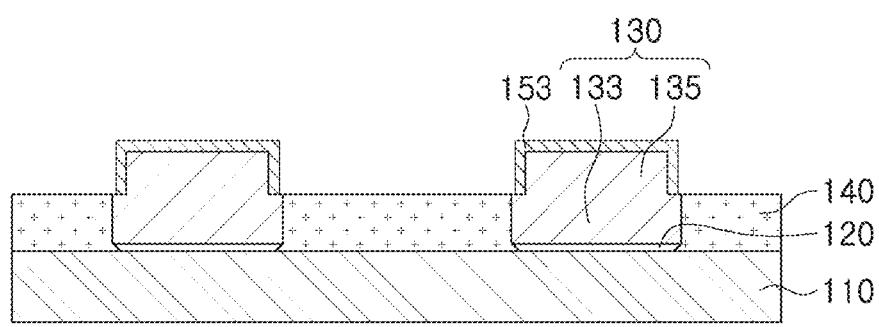

Referring to FIG. 7K, a first surface metal layer 153 is formed. The first surface metal layer 153 may be formed by nickel (Ni) plating, but the present disclosure is not limited thereto. The first metal portion 133 is covered by the second insulating layer 140, and the first surface metal layer 153 may be formed to selectively cover the upper surface and the side surface of the second metal portion 135.

Figure 7L:
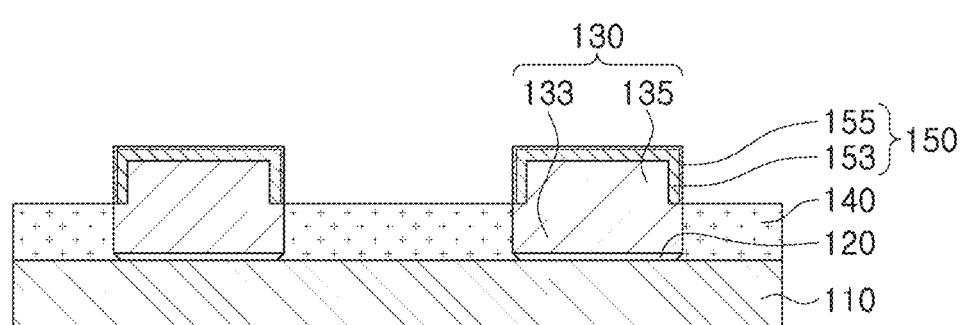

Referring to FIG. 7L, a second surface metal layer 155 is formed. The second surface metal layer 155 may be formed by gold (Au) plating, but the present disclosure is not limited thereto. The second surface metal layer 155 may be formed to cover the surface of the first surface metal layer 153.

The printed circuit board 100A according to the above-described example may be formed through a series of processes, but the manufacturing process is not necessarily limited thereto.

Figure 8:
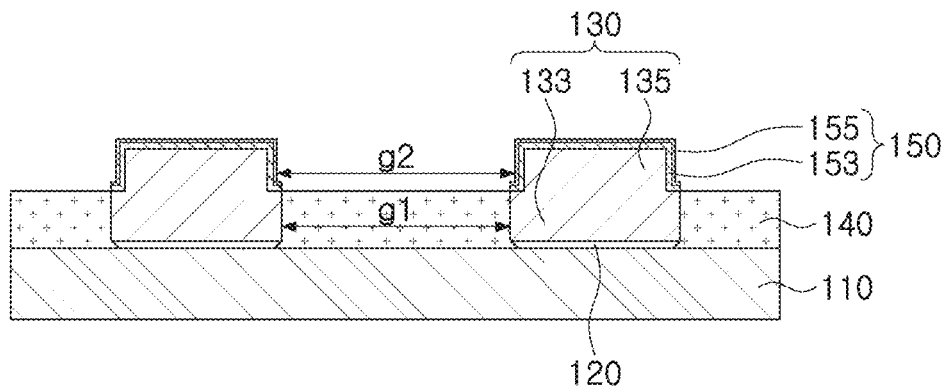
FIG. 8 is a cross-sectional view schematically illustrating another example of a printed circuit board.

FIG. 8 is a cross-sectional view schematically illustrating another example of a printed circuit board.

Referring to the drawings, a printed circuit board 100B according to another example has a thinner surface metal layer 150 as compared to the printed circuit board 100A according to the above-described example. For example, the first surface metal layer 153 may be formed thinner to cover an upper surface of the first metal portion 133, a side surface of the second metal portion 135, and an upper surface of the second metal portion 135.

On the other hand, the metal pad 130 may be present in plural, and the surface metal layer 150 may also be provided as a plurality of surface metal layers 150 to be disposed on the metal pads 130 respectively. In this case, in the printed circuit board 100B according to another example, a gap g1 between the first metal portions 133 of two adjacent metal pads 130 among the plurality of metal pads 130 may be less than a gap g2 between second surface metal layers 155 of two surface metal layers 150 respectively disposed on the two adjacent metal pads 130 from among the plurality of surface metal layers 150. The gap may be a value measured at an intermediate point of the target component with respect to the thickness direction or the lamination direction on the cross-section. In this case, a structure more suitable for a relatively narrower pitch specification may be obtained.

In addition thereto, in related to other descriptions, for example, the contents described in the printed circuit board 100A according to the above-described example may be applied to the printed circuit board 100B according to another example unless contradictory, and a redundant description thereof will be omitted. In addition, the manufacturing example of the printed circuit board 100A according to the above-described example may be similarly applied to the manufacturing of the printed circuit board 100B according to another example.

Figure 9:
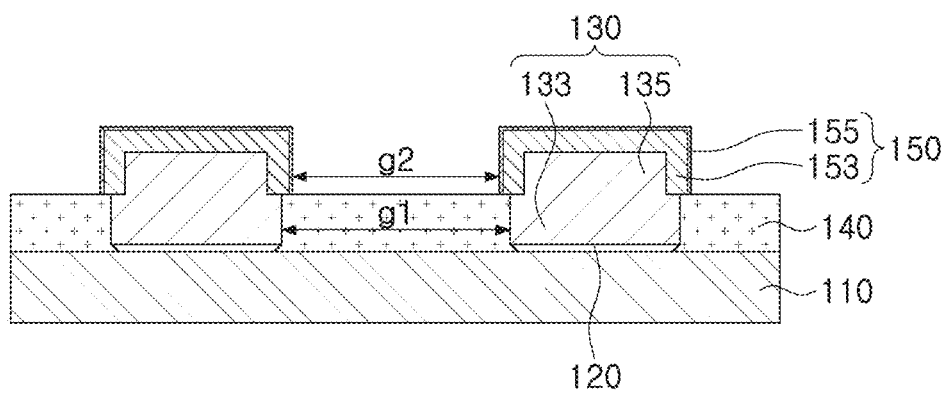
FIG. 9 is a cross-sectional view schematically illustrating another example of a printed circuit board.

FIG. 9 is a cross-sectional view schematically illustrating another example of a printed circuit board.

Referring to the drawings, a printed circuit board 100C according to another example has a thicker surface metal layer 150 than the thickness of the printed circuit board 100A according to the above-described example. For example, the first surface metal layer 153 may be formed to be relatively thicker and may be disposed to extend onto the upper surface of the second insulating layer 140.

On the other hand, the metal pad 130 may be present in plural, and the surface metal layer 150 may also be provided as a plurality of surface metal layers 150 to be disposed on the metal pads 130 respectively. In this case, in the printed circuit board 100C according to another example, a gap g1 between first metal portions 133 of two adjacent metal pads 130 among the plurality of metal pads 130 may be greater than a gap g2 between second surface metal layers 155 of two surface metal layers 150 respectively disposed on the two adjacent metal pads 130 from among the plurality of surface metal layers 150. The gap may be a value measured at an intermediate point of the target component with respect to the thickness direction or the lamination direction on the cross-section. In this case, multiple wire bonding is possible on one bonding finger, and thus, a structure more suitable for specifications requiring relatively high-density signal transmission may be provided.

In addition thereto, in related to other descriptions, for example, the contents described in the printed circuit board 100A according to the above-described example may be applied to the printed circuit board 100C according to another example unless contradictory, and a redundant description thereof will be omitted. In addition, the manufacturing example of the printed circuit board 100A according to the above-described example may be similarly applied to the manufacturing of the printed circuit board 100C according to another example.

As set forth above, as an effect according to an example of the present disclosure, a printed circuit board in which a fine pitch bonding finger may be implemented may be provided.

As another effect among various effects of the present disclosure, a printed circuit board in which damage to the pad from seed etching or pretreatment may be prevented may be provided.

As another effect among the various effects of the present disclosure, a printed circuit board in which a sufficient space margin may be secured even after a metal surface treatment may be provided.

As another effect of the various effects of the present disclosure, a printed circuit board in which a problem caused by an external impact in the stress concentration space between the pad and the insulating material may be prevented may be provided.

In the present disclosure, 'on the cross-section' may indicate a cross-sectional shape when the object is vertically cut, or a cross-sectional shape when the object is viewed from a side-view. In addition, the meaning on a plane may be a shape when the object is horizontally cut, or a flat shape when the object is viewed from a top-view or a bottom-view.

In the present disclosure, the lower side, the lower portion, the lower surface, and the like are used to refer to the direction toward the mounting surface of the semiconductor package including the organic interposer based on the cross section of the drawing for convenience, and the upper side, upper portion, upper surface and the like are used in the direction opposite thereto. However, this is to define the direction for convenience of explanation, and the scope of the claims is not limited by the description in this direction.

The meaning of being connected in the present disclosure is a concept including not only directly connected, but also indirectly connected through an adhesive layer or the like. In addition, the meaning of being electrically connected is a concept including both the case of being physically connected and the case of not being connected. In addition, expressions such as first, second, and the like are used to distinguish one component from another, and do not limit the order and/or importance of the corresponding components. In some cases, without departing from the scope of rights, the first component may be named as the second component, and similarly, the second component may be named as the first component.

The expression "an example" used in the present disclosure does not mean the same embodiment, and is provided to emphasize and explain different unique features. However, the examples presented above are not excluded from being implemented in combination with features of other examples. For example, even if a matter described in one specific example is not described in another example, it may be understood as a description related to another example unless a description contradicts the matter in another example.

The terminology used in the present disclosure is used to describe an example only, and is not intended to limit the present disclosure. In this case, the singular expression includes the plural expression unless the context clearly dictates otherwise.

While embodiments have been illustrated and described above, it will be apparent to those skilled in the art that modifications and variations could be made without departing from the scope of the present disclosure as defined by the appended claims.

What is claimed is:

1. A printed circuit board comprising:
   a first insulating layer;
   a metal pad including a first metal portion disposed on the first insulating layer, and a second metal portion disposed on the first metal portion and integrated with the first metal portion without a boundary therebetween, the second metal portion having a width narrower than a width of the first metal portion on a cross section;
   a second insulating layer disposed on the first insulating layer and covering at least a portion of a side surface of the first metal portion; and
   a surface metal layer disposed on the metal pad and covering at least a portion of each of an upper surface and a side surface of the second metal portion,
   wherein the surface metal layer comprises a first surface metal layer being in contact with an upper surface the first metal portion and spaced apart from the second insulating layer.

2. The printed circuit board of claim 1, wherein the second insulating layer does not cover an upper surface of the first metal portion.

3. The printed circuit board of claim 2, wherein an upper surface of the second insulating layer is substantially coplanar with the upper surface of the first metal portion.

4. The printed circuit board of claim 1, wherein the second insulating layer comprises a solder resist.

5. The printed circuit board of claim 1, wherein the first and second metal portions include copper (Cu).

6. The printed circuit board of claim 1, wherein the surface metal layer further comprises a second surface metal layer disposed on the first surface metal layer.

7. The printed circuit board of claim 6, wherein the first surface metal layer comprises nickel (Ni), and the second surface metal layer comprises gold (Au).

8. The printed circuit board of claim 6, wherein a plurality of surface metal layers are respectively disposed on a plurality of metal pads, and an interval between first metal portions of two adjacent metal pads among the plurality of the metal pads is substantially equal to an interval between second surface metal layers of two surface metal layers respectively disposed on the two adjacent metal pads from among the plurality of the surface metal layers.

9. The printed circuit board of claim 6, wherein a plurality of surface metal layers are disposed on a plurality of metal pads, respectively, and an interval between first metal portions of two adjacent metal pads among the plurality of the metal pads is less than an interval between second surface metal layers of two surface metal layers respectively disposed on the two adjacent metal pads from among the plurality of the surface metal layers.

10. The printed circuit board of claim 6, wherein a plurality of surface metal layers are respectively disposed on a plurality of metal pads, and an interval between first metal portions of two adjacent metal pads among the plurality of metal pads is greater than an interval between second surface metal layers of two surface metal layers respectively disposed on the two adjacent metal pads from among the plurality of surface metal layers.

11. The printed circuit board of claim 1, wherein respective side surfaces of the first and second metal portions have a substantially vertical shape, and
   an edge of an upper surface of each of the first and second metal portions has a substantially angular shape.

12. A printed circuit board comprising:
   a first insulating layer;
   a seed metal layer disposed on the first insulating layer;
   a metal pad including a first metal portion disposed on the seed metal layer, and a second metal portion disposed on the first metal portion and integrated with the first metal portion without a boundary therebetween, the second metal portion having a width narrower than a width of the first metal portion on a cross-section; and
   a second insulating layer disposed on the first insulating layer, the second insulating layer covering at least a portion of a side surface of the first metal portion and spaced apart from an upper surface of the first metal portion,
   wherein a width of a portion of the seed metal layer being in contact with the first insulating layer is less than a width of the first metal portion.

13. The printed circuit board of claim 12, wherein the seed metal layer is spaced apart from the second metal portion.

14. The printed circuit board of claim 12, wherein the seed metal layer includes copper (Cu).

15. The printed circuit board of claim 12, wherein at least a portion of a side surface of the seed metal layer has a groove portion, and
   the second insulating layer is disposed in at least a portion of the groove portion.

16. The printed circuit board of claim 15, wherein at least one surface of the groove portion has a tapered shape.

17. A printed circuit board comprising:
   a first insulating layer;
   a metal pad including a first metal portion disposed on a surface of the first insulating layer, and a second metal portion disposed on the first metal portion and having a width narrower than a width of the first metal portion;
   a second insulating layer disposed on the first insulating layer and covering at least a portion of a side surface of the first metal portion; and
   a surface metal layer covering at least a portion of an upper surface of the second metal portion,
   wherein with reference to the surface of the first insulating layer, a height of an upper surface of the second insulating layer is smaller than a height of an upper surface of the second metal portion,
   the surface metal layer comprises a first surface metal layer being in contact with the upper surface the first metal portion and spaced apart from the second insulating layer.

18. The printed circuit board of claim 17, wherein the surface metal layer extends from the upper surface of the second metal portion to cover at least a portion of a side surface of the second metal portion.

19. The printed circuit board of claim 18, wherein the surface metal layer is in contact with an upper surface of the first metal portion.

20. The printed circuit board of claim 17, wherein the surface metal layer further comprises a second surface metal layer disposed on the first surface metal layer.

21. The printed circuit board of claim 20, wherein the first surface metal layer comprises nickel (Ni), and the second surface metal layer comprises gold (Au).

22. The printed circuit board of claim 17, wherein a metal of the surface metal layer is different from a metal of the metal pad.

23. The printed circuit board of claim 17, wherein the second insulating layer is in contact with the first metal portion.

24. The printed circuit board of claim 17, further comprising a seed metal layer between the first insulating layer and the metal pad.

25. The printed circuit board of claim 24, wherein the surface metal layer is spaced apart from the seed metal layer.

* * * * *